(12) United States Patent
Baeck (10) Patent No.: US 11,322,621 B2
(45) Date of Patent: May 3, 2022

(54) THIN FILM TRANSISTOR, DISPLAY INCLUDING THE SAME, AND METHOD OF FABRICATING THE SAME

(71) Applicant: LG Display Co., Ltd., Seoul (KR)

(72) Inventor: Ju-Heyuck Baeck, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/921,660

(22) Filed: Jul. 6, 2020

(65) Prior Publication Data

US 2020/0335629 A1 Oct. 22, 2020

Related U.S. Application Data

(63) Continuation of application No. 15/394,229, filed on Dec. 29, 2016, now Pat. No. 10,741,693.

(30) Foreign Application Priority Data

Dec. 31, 2015 (KR) .................. KR10-2015-0191709

(51) Int. Cl.
*H01L 21/00* (2006.01)
*H01L 27/00* (2006.01)
(Continued)

(52) U.S. Cl.
CPC .... *H01L 29/7869* (2013.01); *H01L 21/02532* (2013.01); *H01L 21/02565* (2013.01);
(Continued)

(58) Field of Classification Search
CPC . H01L 21/02532; H01L 21/385; H01L 21/44; H01L 21/02565; H01L 27/1225;
(Continued)

(56) References Cited

U.S. PATENT DOCUMENTS 8,592,811 B2 * 11/2013 Suzuki ................ H01L 27/1244
257/43
9,153,699 B2 10/2015 Yamazaki
(Continued)

FOREIGN PATENT DOCUMENTS

CN 102208452 A 10/2011
JP 2011-146694 A1 7/2011
(Continued)

OTHER PUBLICATIONS

China National Intellectual Property Administration, First Notification of Office Action, CN Patent Application No. 201611243483.3, dated Nov. 1, 2019, 19 pages.
(Continued)

*Primary Examiner* — Nikolay K Yushin
(74) *Attorney, Agent, or Firm* — Fenwick & West LLP (57) ABSTRACT

A thin film transistor includes a gate electrode, an active layer formed of oxide semiconductor material on a substrate, and a gate insulation layer therebetween. The active layer includes a channel region corresponding to the gate electrode, a source region at one side of the channel region, and a drain region at the other side of the channel region. The source region includes a first upper portion and the drain region includes a second upper portion that includes the oxide semiconductor material and Si.

20 Claims, 9 Drawing Sheets

(51) Int. Cl.
| | |
|---|---|
| *H01L 29/00* | (2006.01) |
| *H01L 29/786* | (2006.01) |
| *H01L 21/02* | (2006.01) |
| *H01L 21/385* | (2006.01) |
| *H01L 21/44* | (2006.01) |
| *H01L 27/12* | (2006.01) |
| *H01L 29/267* | (2006.01) |
| *H01L 29/66* | (2006.01) |

(52) U.S. Cl.
CPC ............ *H01L 21/385* (2013.01); *H01L 21/44* (2013.01); *H01L 27/1225* (2013.01); *H01L 27/1259* (2013.01); *H01L 29/267* (2013.01); *H01L 29/66969* (2013.01); *H01L 29/78606* (2013.01); *H01L 29/78618* (2013.01)

(58) Field of Classification Search
CPC ............... H01L 27/1259; H01L 27/124; H01L 27/1203; H01L 29/267; H01L 29/7869; H01L 29/66969; H01L 29/78618; H01L 29/78606
See application file for complete search history.

(56) References Cited

U.S. PATENT DOCUMENTS

| | | | |
|---|---|---|---|
| 9,240,488 | B2 | 1/2016 | Yamazaki et al. |
| 9,378,980 | B2 | 6/2016 | Yamazaki et al. |
| 9,437,747 | B2 | 9/2016 | Yamazaki |
| 9,704,932 | B2 * | 7/2017 | Lee ..................... H01L 27/3244 |
| 9,728,651 | B2 | 8/2017 | Yamazaki et al. |
| 9,859,437 | B2 | 1/2018 | Morosawa et al. |
| 10,032,926 | B2 | 7/2018 | Yamazaki |
| 10,453,964 | B2 | 10/2019 | Yamazaki et al. |
| 10,483,404 | B2 | 11/2019 | Yamazaki |
| 2010/0244020 | A1 | 9/2010 | Sakata et al. |
| 2011/0147738 | A1 | 6/2011 | Yamazaki et al. |
| 2011/0240998 | A1 | 10/2011 | Morosawa et al. |
| 2013/0187152 | A1 | 7/2013 | Yamazaki et al. |
| 2013/0207114 | A1 * | 8/2013 | Suzuki ................. G02F 1/13458 257/59 |
| 2013/0334533 | A1 | 12/2013 | Yamazaki |
| 2014/0312342 | A1 | 10/2014 | Yamazaki |
| 2015/0230349 | A1 * | 8/2015 | Lee ..................... H04M 1/0268 361/749 |
| 2016/0027923 | A1 | 1/2016 | Yamazaki |
| 2016/0093721 | A1 | 3/2016 | Yamazaki et al. |
| 2016/0233338 | A1 | 8/2016 | Lu et al. |
| 2016/0293767 | A1 | 10/2016 | Yamazaki et al. |
| 2016/0359051 | A1 | 12/2016 | Yamazaki |
| 2017/0323976 | A1 | 11/2017 | Yamazaki et al. |
| 2018/0076330 | A1 | 3/2018 | Morosawa et al. |
| 2018/0323308 | A1 | 11/2018 | Yamazaki |

FOREIGN PATENT DOCUMENTS

| | | |
|---|---|---|
| JP | 2011-228622 | 11/2011 |
| JP | 2012-119664 | 6/2012 |
| JP | 2013-153093 | 8/2013 |
| JP | 2013-175710 | 9/2013 |
| JP | 2014-027263 A | 2/2014 |
| JP | 2014-082390 | 5/2014 |
| WO | WO 2011/162177 | 12/2011 |

OTHER PUBLICATIONS

Extended European Search Report for European Patent Application No. EP 16207240.9, dated May 22, 2017, 7 Pages.
Japan Patent Office, Notice of Reasons for Refusal, JP Patent Application No. 2018-168516, dated Dec. 10, 2019, six pages.
Notice of Reason for Refusal for Japanese Patent Application No. JP 2016-255713, dated Oct. 26, 2017, 11 Pages.
United States Office Action, U.S. Appl. No. 15/394,229, filed Oct. 17, 2019, ten pages.
United States Office Action, U.S. Appl. No. 15/394,229, filed Mar. 21, 2019, nine pages.
United States Office Action, U.S. Appl. No. 15/394,229, dated Oct. 3, 2018, eight pages.
United States Office Action, U.S. Appl. No. 15/394,229, filed Jan. 31, 2018, eight pages.

* cited by examiner

THIN FILM TRANSISTOR, DISPLAY INCLUDING THE SAME, AND METHOD OF FABRICATING THE SAME

CROSS-REFERENCE TO RELATED APPLICATIONS

This application is a continuation application of U.S. patent application Ser. No. 15/394,229, filed on Dec. 29, 2016, which claims the benefit of Republic of Korea Patent Application No. 10-2015-0191709, filed on Dec. 31, 2015, all of which are hereby incorporated by reference as if fully set forth herein.

BACKGROUND

Field of the Disclosure

The present disclosure relates to a thin film transistor, a method of fabricating the same, and a display device including the same, and more particularly, to a thin film transistor with improved device characteristics, a display device including the same, and a method of fabricating the same.

Discussion of the Related Art

A display device that displays various information on a screen is a core technology of the information technology age. The display device is developed to become thin, light, portable, and high-functionality. To this end, a flat display device has been of interest since weight and volume, which are disadvantages of cathode ray tubes (CRTs), are reduced.

The flat display device includes thin film transistors disposed on every pixel which is disposed on a display panel for displaying an image. Thin film transistors may be classified into various types according to various positions of a gate electrode, a source electrode, and an active layer.

Figure 1:
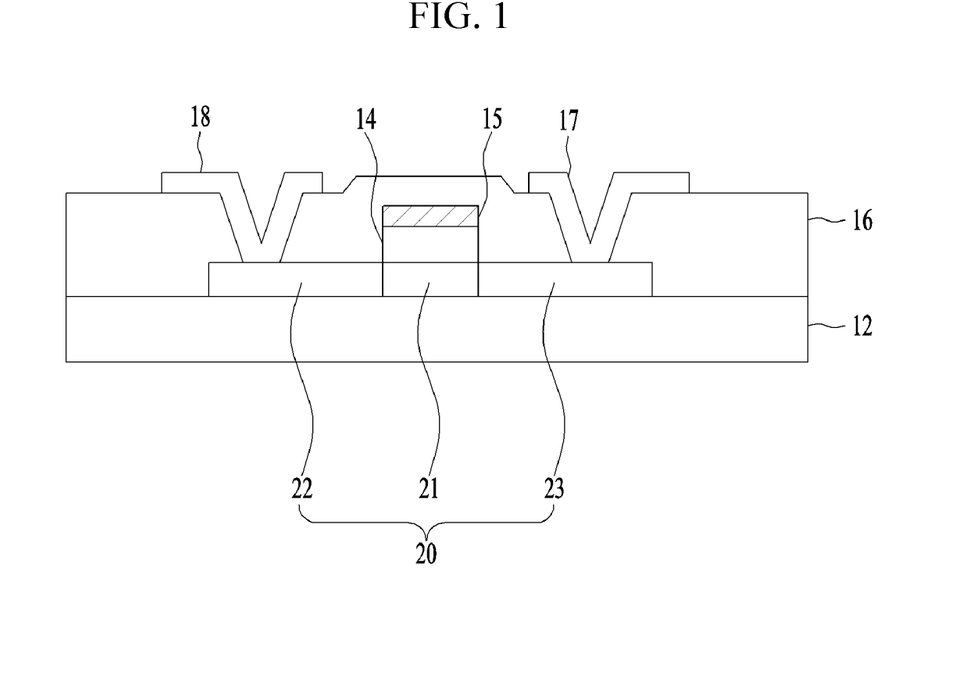
FIG. 1 is a cross-sectional view illustrating a conventional thin film transistor having a coplanar structure.

FIG. 1 is a cross-sectional view illustrating a conventional thin film transistor having a coplanar structure.

Referring to FIG. 1, the thin film transistor of the coplanar structure includes a gate electrode 15, a gate insulation layer 14, a drain electrode 17, and a source electrode 18 on an active layer 20.

A process of patterning a gate insulation layer 14 and the gate electrode 15 on the active layer 20 includes a dry etching process. A channel region 21 of the active layer 20 is protected from an etchant gas by the gate electrode 15 during the dry etching process, but upper surfaces of a source region 22 and a drain region 23 of the active layer 20 are exposed to the etchant gas.

Herein, portions having a thickness of 100 Å from the upper surfaces of the source region 22 and the drain region 23 are damaged by the etchant gas, and lose oxygen and become an oxygen-deficient state. The oxygen-deficient source and drain regions 22 and 23 become conductive regions having low contact resistance.

Meanwhile, an interlayer insulation layer 16 is formed on the conductive source and drain regions 22 and 23. When the interlayer insulation layer 16 of $SiO_2$ covers the conductive regions, oxygen in $SiO_2$ is diffused into the source and drain regions 22 and 23, such that the source and drain regions 22 and become less conductive. As a result, contact resistance between the source region 22 and the source electrode 18, and the drain region 23 and the drain electrode 17 is increased, and properties of the thin film transistor are degraded.

SUMMARY

Accordingly, an embodiment of the present disclosure is directed to a thin film transistor, a display device including the same and a method of fabricating the same that substantially obviates one or more problems due to limitations and disadvantages of the related art.

An object of the present disclosure is to provide a thin film transistor improving properties thereof and a display device including the same by preventing diffusion of oxygen from an interlayer insulation layer into the conductive source/drain regions for maintaining conductivity of source/drain regions and lowering contact resistance between the source/drain regions and source/drain electrodes.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with an embodiment of the present disclosure, the above and other objects can be accomplished by the provision of a thin film transistor including an active layer on a substrate, the active layer including a source region, a drain region and a channel region between the source region and the drain region, a gate insulation layer and a gate electrode sequentially stacked on the channel region, oxidation protection layers formed at the source and drain regions, respectively, an interlayer insulation layer on a buffer layer and the oxidation protection layers, the interlayer insulation layer having first and second contact holes corresponding to the source and drain regions, respectively, and a source electrode and a drain electrode contacting the oxidation protection layers through the first and second contact holes, respectively.

The oxidation protection layers may be disposed on a surface the active layer by diffusing Si the same material as the material of the active layer.

The oxidation protection layers may have a thickness of 50 to 100 Å.

Embodiments also relate to a thin film transistor. The thin film transistor includes a gate electrode and an active layer of oxide semiconductor on a substrate. The active layer includes a channel region corresponding to the gate electrode, a source region at one side of the channel region, and a drain region at the other side of the channel region. The source region includes a first upper portion that includes the oxide semiconductor and Si, and the drain region includes a second upper portion that includes the oxide semiconductor and Si.

Embodiments also relate to a method of manufacturing a thin film transistor. An active layer of oxide semiconductor is formed on a substrate. The active layer includes a channel region, a source region at one side of the channel region, and a drain region at the other side of the channel region. Si is added into a first upper portion of the source region and a second upper portion of the drain region.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF EMBODIMENTS

Hereinafter, reference will be made in detail to embodiments of the disclosure, examples of which are illustrated in the accompanying drawings.

Figure 2:
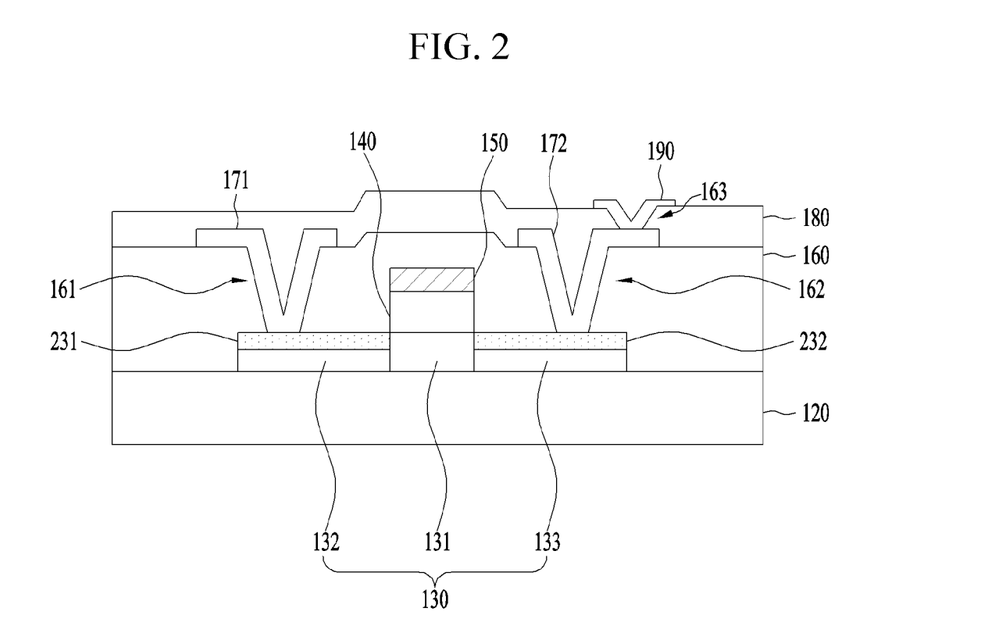
FIG. 2 is a cross-sectional view illustrating a thin film transistor according to an embodiment of the present disclosure.

FIG. 2 is a cross-sectional view illustrating a thin film transistor according to an embodiment of the present disclosure.

Referring to FIG. 2, the thin film transistor according to the embodiment of the present disclosure includes a substrate 120, an active layer 130 disposed on the substrate 120 and including a channel region 131, a source region 132, and a drain region 133, a gate insulation layer 140, and a gate electrode 150. The gate insulation layer 140 and the gate electrode 150 are sequentially stacked on the channel region 131. The thin film transistor also includes a first diffused portion 231 and a second diffused portion 232 formed at upper portions of the source region 132 and the drain region 133, respectively. The thin film transistor also includes an interlayer insulating layer 160 formed on the substrate 120 and on the first and second diffused portions 231 and 232. The interlayer insulating layer 160 has a first contact hole 161 and a second contact hole 162 corresponding to the source region 132 and the drain region 133, respectively. A source electrode 171 contacts the first diffused portion 231 through the first contact hole 161 and a drain electrode 172 contacts the second diffused portion 232 through the second contact hole 162. A passivation layer 180 formed on the interlayer insulating layer 160 has a third contact hole 163 corresponding to an upper surface of the drain electrode 172, and a pixel electrode 190 is connected to the drain electrode 172 through the third contact hole.

The substrate 120 is a base for forming the thin film transistor. The substrate 120 may be formed of silicon, glass, plastic, etc., without being limited thereto.

Meanwhile, although not shown in FIG. 2, the substrate 120 may include a buffer layer thereon. The buffer layer prevents diffusion of moisture and impurities generated from the substrate 120. The buffer layer is formed as a single layer structure consisting of SiO$_2$. Alternatively, the buffer layer may be formed as a double-layer structure in which silicon nitride (SiNx) and silicon oxide (SiOx) are sequentially stacked.

The active layer 130 is formed on the substrate 120. The active layer 130 includes the channel region 131 disposed at a center thereof, the source region 132 disposed at one side of the channel region 131, and the drain region 133 disposed at the other side of the channel region 131.

The channel region 131 overlaps the gate electrode 150 with the gate insulation layer 140 interposed therebetween to form a channel between the source electrode 171 and the drain electrode 172. The source region 132 becomes conductive from the metal oxide semiconductor material of the active layer 130, such that the source region 132 is in electrical contact with the source electrode 171 through the first contact hole 161 with the first diffused portion 231 interposed between the source region 131 and the source electrode 171. The drain region 133 becomes conductive from the metal oxide semiconductor material of the active layer 130 such that the drain region 133 is in electrical contact with the drain electrode 172 through the second contact hole 162 with the second diffused portion 232 interposed between the drain region 133 and drain electrode 172.

A group IV metal oxide compound such as an indium tin gallium zinc oxide (InSnGaZnO) material, a group III metal oxide compound such as an indium gallium zinc oxide (InGaZnO) material, an indium tin zinc oxide (InSnZnO) material, an indium aluminum zinc oxide (InAlZnO) material, an indium hafnium zinc oxide (InHfZnO) material, a tin gallium zinc oxide (SnGaZnO) material, an aluminum gallium zinc oxide (AlGaZnO) material, and a tin aluminum zinc oxide (SnAlZnO), a group II metal oxide compound such as an indium zinc oxide (InZnO) material, a tin zinc oxide (SnZnO) material, an aluminum zinc oxide (AlZnO) material, a zinc magnesium oxide (ZnMgO) material, a tin magnesium oxide (SnMgO) material, an indium magnesium oxide (InMgO) material, an indium gallium oxide (InGaO) material, or an indium oxide (InO) material, a tin oxide (SnO) material, and a zinc oxide (ZnO) material may be used as the active layer 130. A ratio of composition of each element included in a material for oxide semiconductor in the active layer 130 may be not limited but may be variously adjusted.

Electrical conductivity of the active layer 130 formed of an oxide semiconductor material is decreased as an amount of oxygen or ratio of oxygen is increased. On the other hand, electrical conductivity of the active layer 130 is increased as an amount of oxygen or ratio of oxygen is decreased.

The first and second diffused portions 231 and 232 include the first diffused portion 231 formed at an upper portion of the source region 132 and the second diffused portion 232 formed at an upper portion of the drain region 133.

The first and second diffused portions 231 and 232 are formed on oxygen-deficient upper portions of the source and drain regions 132 and 133. The active layer 130 is formed of the above-described oxide semiconductor. The first and second diffused portions 231 and 232 are formed of the same oxide semiconductor material as the active layer 130 the addition of diffusive material, such as Si. Specifically, the diffused portions 231 and 232 may have a greater number or proportion of oxygen vacancies than the remaining portions of the source and drain regions 132 and 133 or the channel region 131. At least a portion of the oxygen vacancies in the diffused portions 231 and 232 may be replaced by the diffusive material, such as Si. In other words, the diffused portions 231 and 232 are diffused with a first material.

In one particular example referred throughout the remainder of the specification, the diffusive material is Si. However, it is appreciated that in other examples, the diffusive material may include any other material that can replace oxygen vacancies in oxide semiconductor material, such as carbon (C), silicon (Si), Germanium (Ge), Tin (Sn), and the like.

The first and second diffused portions 231 and 232 containing the Si are formed to contact the interlayer insulating layer 160. Alternatively, the first and second diffused portions 231 and 232 can be formed with additional layers in between the interlayer insulating layer 160. Moreover, when the diffused portions 231 and 232 constitute a part of the source region 132 and the drain region 133, respectively, the source region 132 may have a first diffused portion 231 that includes Si, and a first lower portion below the first diffused portion 231 that does not include Si. Similarly, the drain region 133 may have a second diffused portion 232 that includes Si, and a second lower portion below the second diffused portion 232 that does not include Si. Alternatively, when the source region 132 and the drain region 133 are relatively thin, the Si may be diffused throughout an entirety of the source region 132 and the drain region 133.

The oxygen concentration in the first and second diffused portions 231 and 232 is 20% to 80% of the oxygen concentration in a portion of the channel region 131 that does not include Si. The oxygen concentration in the first diffused portion 231 may be 20 to 80% of the oxygen concentration in a first lower portion of the source region 132 that is located below the first diffused portion 231. Similarly, the oxygen concentration in the second diffused portion 232 may be 20 to 80% of the oxygen concentration in a second lower portion of the drain region 133 that is located below the second diffused portion 232. As defined herein, oxygen concentration refers to the amount of oxygen per unit volume.

When the gate insulation layer 140 is patterned, the at least a region of the source and drain regions 132 and 133 become conductive due to the etchant gas. The diffused portions 231 and 232 prevent conductive regions of the source and drain regions 132 and 133 from being oxidized by the deposition of the interlayer insulation layer 160.

Specifically, when the gate insulation layer 140 and the gate electrode 150 are patterned, upper portions near the surface of the source and drain regions 132 and 133 are directly exposed to the etchant gas used in the etching process, and are damaged. Therefore, although lower parts of the source and drain regions 132 and 133 are not affected, portions of the source and drain regions 132 and 133 within a thickness of 50 Å to 100 Å from the upper surface of the source and drain regions 132 and 133 release oxygen, and become oxygen-deficient and conductive.

Examples of such etchant gas that create oxygen-deficient portions may be $CF_4$ or $FH_6$ but is not limited thereto, and may be any other etchant gas for etching the gate insulation layer 140.

In an embodiment of the present disclosure, a Si layer is deposited on the upper surfaces of the source and drain regions 132 and 133 and is heated. In one example, heating the Si layer may include thermally processing the Si layer. Thereby, Si is diffused into the source and drain regions 132 and 133 and replaces oxygen vacancies. Herein, Si is diffused for a thickness of approximately 50 Å to 100 Å from the upper surface of the source and drain regions 132 and 133. As a result, diffusion of oxygen from the interlayer insulating layer 160 formed of $SiO_2$ throughout the source and drain regions 132 and 133 may be prevented.

Meanwhile, when a layer of conductive material such as a metal are formed instead of the formation of diffused portions 231 and 232 by diffusion of Si into the oxide semiconductor, a separate dry etching process is further performed to remove the conductive material on the channel region 131 and pattern the conductive material only on the source and drain regions 132 and 133. During the dry etching process, the channel region 131 may be exposed to the etchant gas to become conductive, thereby losing the function as the channel region 131.

If there are no diffused portions 231 and 232, oxygen of $SiO_2$ included in the interlayer insulation layer 160 is diffused into the source region 132 and the drain region 133 during formation of the interlayer insulation layer 160, thereby lowering electrical conductivity of the source and drain regions 132 and 133. Accordingly, contact resistance between the source and drain electrodes 171 and 172 and the source and drain regions 132 and 133 is increased and electron mobility is decreased.

The interlayer insulation layer 160 includes the first contact hole 161 such that the source electrode 171 is electrically connected to at least an exposed portion of the first diffused portion 231 formed at an upper portion of the source region 132. Furthermore, the interlayer insulation layer 160 includes the second contact hole 162 such that the drain electrode 172 is in contact with at least an exposed portion of the second diffused portion 232 formed at an upper portion of the drain region 133.

The interlayer insulation layer 160 is formed of $SiO_2$. The first and second diffused portions 231 and 232 are formed by depositing the Si layer on the active layer 130 and heating the deposited Si layer.

Herein, a portion of the Si in the Si layer is diffused into the source region 132 and the drain region 133, and another portion of the Si is oxidized to form a $SiO_2$ layer. The $SiO_2$ layer formed from an oxidized portion of the Si from the Si layer can be a part of the subsequently deposited interlayer insulation layer 160 that is also formed of $SiO_2$. Thus, $SiO_2$ formed when forming the diffused portions 231 and 232 does not need to be removed.

The source electrode 171 is in contact with the first diffused portion 231 of the source region 132 through the first contact hole 161. The drain electrode 172 is in contact with the second diffused portion 232 of the drain region 133 through the second contact hole 162.

Source and drain metal layers may be single layer or multiple layers formed of a metallic material such as Mo, Ti, Cu, AlNd, Al, Cr, or alloys thereof.

The passivation layer 180 is formed on the interlayer insulation layer 160, the source electrode 171, and the drain electrode 172. The passivation layer 180 includes the third contact hole 163 such that a pixel electrode 190 may be connected to the drain electrode 172 below the passivation layer 180.

The pixel electrode 190 is in contact with the drain electrode 172 through the third contact hole 163.

Hereinafter, a method of manufacturing the thin film transistor will be explained in detail with reference to the accompanying FIG. 3 and FIGS. 4A to 4G.

Figure 3:
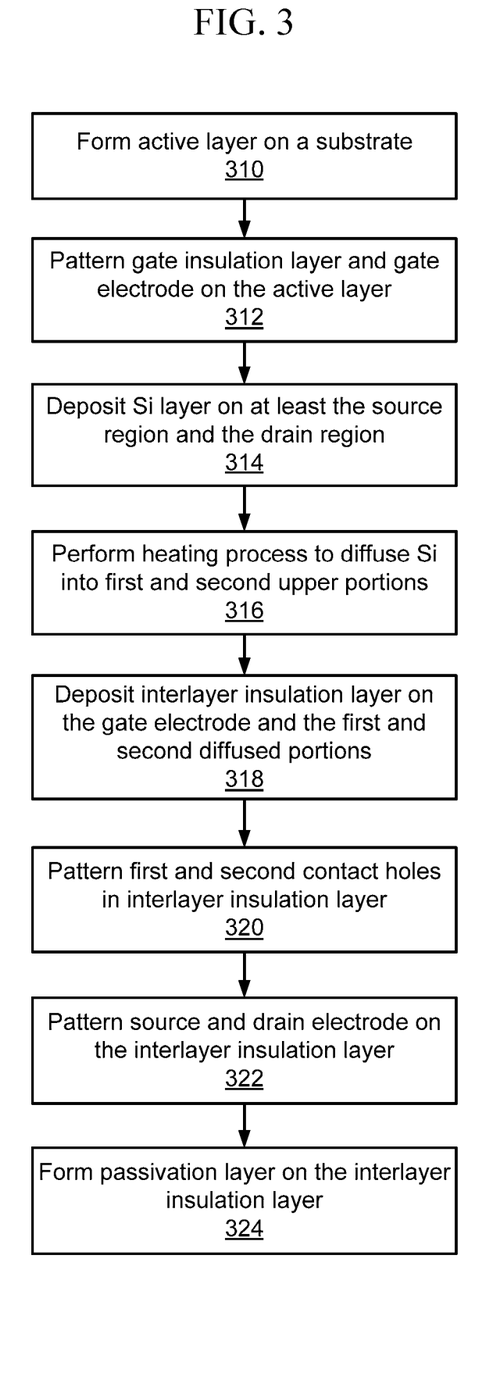
FIG. 3 is a flowchart illustrating a method of manufacturing the thin film transistor according to the illustrated embodiment of the present disclosure.
Figure 4A:
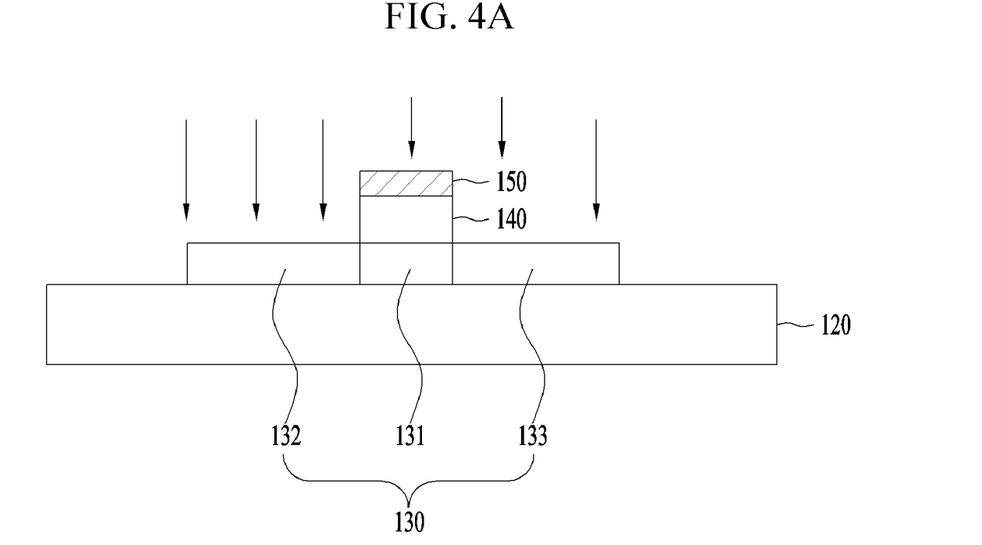
FIGS. 4A to 4G are cross-sectional views illustrating the method of manufacturing the thin film transistor according to the illustrated embodiment of the present disclosure.

As illustrated in FIGS. 3 and 4A, the active layer 130 is formed 310 on the substrate 120. In addition, the gate insulation layer 140 and the gate electrode 150 are patterned 312 on the active layer 130. Herein, the substrate 120 may further include the buffer layer thereon, although not shown in FIG. 4A.

In detail, after an oxide semiconductor material, as described above, is entirely deposited on the substrate 120 using a sputtering process, the oxide semiconductor material is patterned using a photolithography process and an etching process to form the active layer 130. The active layer 130 is classified into the channel region 131 at the center thereof, the source region 132 at one side of the channel region 132, and the drain region 133 at the other side of the channel region 131.

A gate insulating material is formed on the active layer 130 using a chemical vapor deposition (CVD) process and a gate metallic layer is formed on the gate insulting material using a deposition process such as a sputtering process. $SiO_2$ is used as the gate insulting material and a metallic material such as Mo, Ti, Cu, AlNd, Al, Cr or alloys thereof is used as the gate metallic layer. Sequentially, the gate insulating material and the gate metallic layer are simultaneously patterned using a photolithography process and a dry etching process to simultaneously form the gate insulation layer 140 and the gate electrode 150 which have the same pattern.

In the dry etching process for patterning the gate electrode 150 and the gate insulation layer 140, the gate electrode 150 on the channel region 131 and the source and drain regions 132 and 133 of the active layer 130 are exposed to the etchant gas. Herein, the channel region 131 is not exposed to the etchant gas by the gate electrode 150 but the source region 132 and the drain region 133 are exposed to the etchant gas such that 85% of oxygen included in an upper portion of the source and drain regions 132 and 133 formed of oxide semiconductor is released and thus, the upper portions of the source and drain regions 132 and 133 become conductive. Thus, due to the etchant gas, the number or proportion of oxygen vacancies in the upper portions of the source and drain regions 132 and 133 may be greater than that of the channel region 131.

Figure 4B:
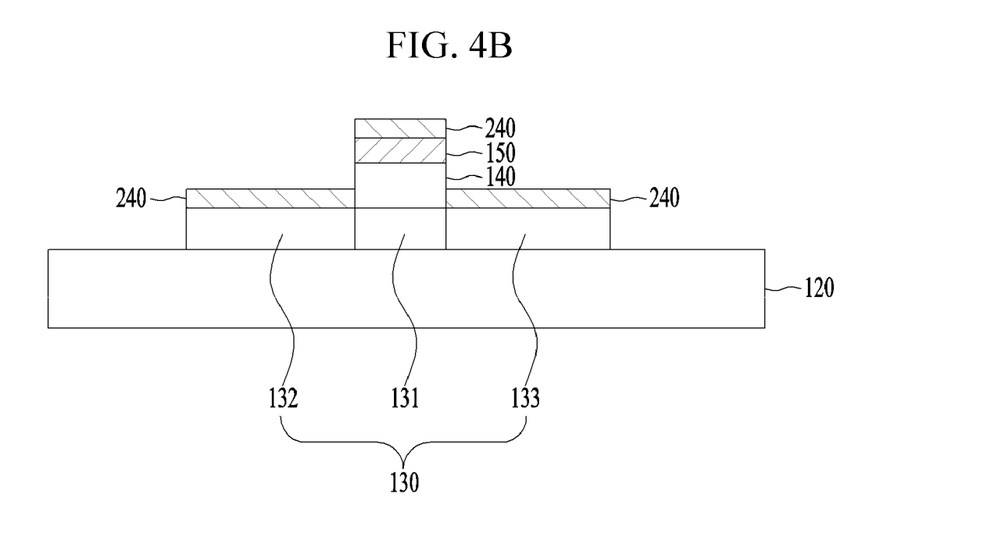
Figure 4C:
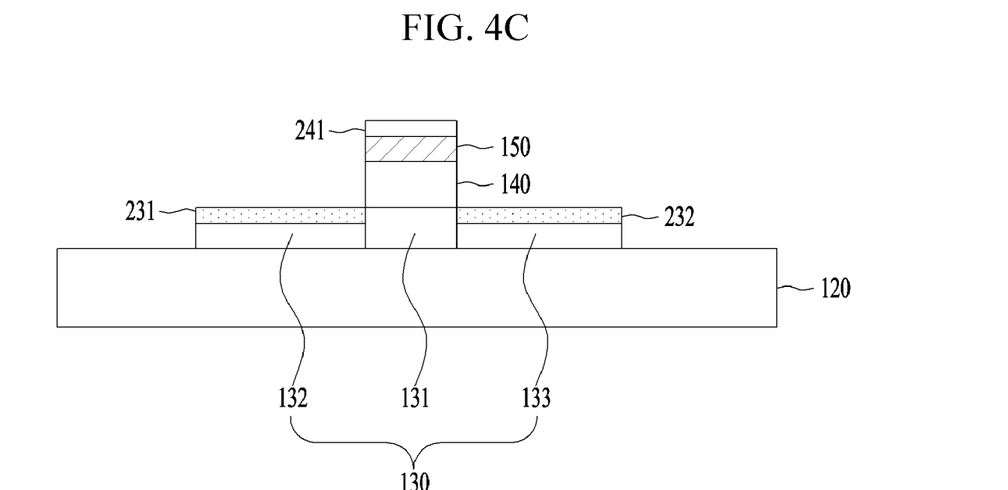

As illustrated in FIGS. 3, 4B, and 4C, after a Si layer 240 is deposited 314 on at least the source region 132 and the drain region 133 of the active layer 130. Si is added into the source region 132 and the drain region 133 to form the first and second diffused portions 231 and 232. Specifically, in one embodiment, a heating process is performed 316 to diffuse the Si into first and second diffused portions 231 and 232. Diffusing Si is an example of adding Si into the first and second diffused portions 231 and 232, but other methods of adding Si may also be performed. The first and second diffused portions 231 and 232 are formed into conductive portions of the source and drain regions 132 and 133 such that diffusion of oxygen from the interlayer insulation layer 160 formed of $SiO_2$ is prevented. Thus, the source region 132 may include the diffused portion 231 containing Si and a first lower portion below the diffused portion 231 without Si. The drain region 133 may include the diffused portion 232 containing Si and a second lower portion below the diffused portion 232 without Si.

The oxygen concentration in the first diffused portion 231 is 20% to 80% of the oxygen concentration in the channel region 131. The oxygen concentration in the second diffused portion 232 is 20 to 80% of the oxygen concentration of the channel region 131. In other words, Si is diffused into the upper portions of the source and drain regions 231 and 232 to replace oxygen vacancies. Also, the oxygen concentration in the first diffused portion 231 may be 20 to 80% of the oxygen concentration in a first lower portion of the source region 132 located below the first diffused portion 231. The oxygen concentration in the second diffused portion 232 may be 20 to 80% of the oxygen concentration in a second lower portion of the drain region 133 located below the second diffused portion 232.

In detail, as illustrated in FIG. 4B, the Si layer 240 is deposited on the active layer 130 and the gate electrode 150 to have a thickness of 30 Å to 50 Å.

As illustrated in FIG. 4C, the heating process is performed. After heating, Si is diffused from the Si layer 240 into the source and drain regions 132 and 133 to form the first and second diffused portions 231 and 132. In one embodiment, the amount of Si diffused into the source and drain regions 132 and 133 is from $1 \times 10^{22}$ atoms/cm$^3$ to $4 \times 10^{22}$ atoms/cm$^3$.

Furthermore, the Si layer 240 formed at the upper part of the gate electrode 150 is oxidized and is converted into a $SiO_2$ layer 241. Thereby, the $SiO_2$ layer 241 becomes a part of the interlayer insulation layer 160. Meanwhile, a $SiO_2$ layer, which is formed from Si that was oxidized but not diffused into the source and drain regions 132 and 133, may be formed on the source region 132 and the drain region 133. Like the channel region 131, the $SiO_2$ formed from oxidation becomes a part of the interlayer insulation layer 160 which will be formed in one or more subsequent processes. Accordingly, there is no a separate process for removal of $SiO_2$.

The necessary thickness of each of first and second diffused portions 231 and 232 of the source and drain regions 132 and 133 is about 100 Å. When a thickness of the Si layer 240 is below 30 Å, the corresponding formed diffused portions do not have a thickness of 50 to 100 Å in spite of the diffusion of Si using the heating process. When a thickness of the Si layer 240 is above 50 Å, the Si layer 240 is not entirely converted to $SiO_2$ but a portion of the Si layer 240 remains after the heating process. Accordingly, the thickness of the Si layer 240 deposited on the active layer 130 may be 30 to 50 Å.

When first and second diffused portions 231 and 232 are not present, the interlayer insulation layer 160 formed of $SiO_2$ on the active layer 130 supplies oxygen to the oxygen-deficient portions of the source and drain regions 132 and 133 of the active layer 130 to decrease electron mobility of the source and drain regions 132 and 133 of the active layer 130. When the source electrode 171 and the drain electrode 172 are formed at the source and drain regions 132 and 133 to which oxygen is supplied, respectively, contact resistance between the source region 132 and the source electrode 171 and contact resistance between the drain region 133 and the drain electrode 172 are increased. Thereby, electron mobility decreases and properties of the thin film transistor are diminished.

Figure 4D:
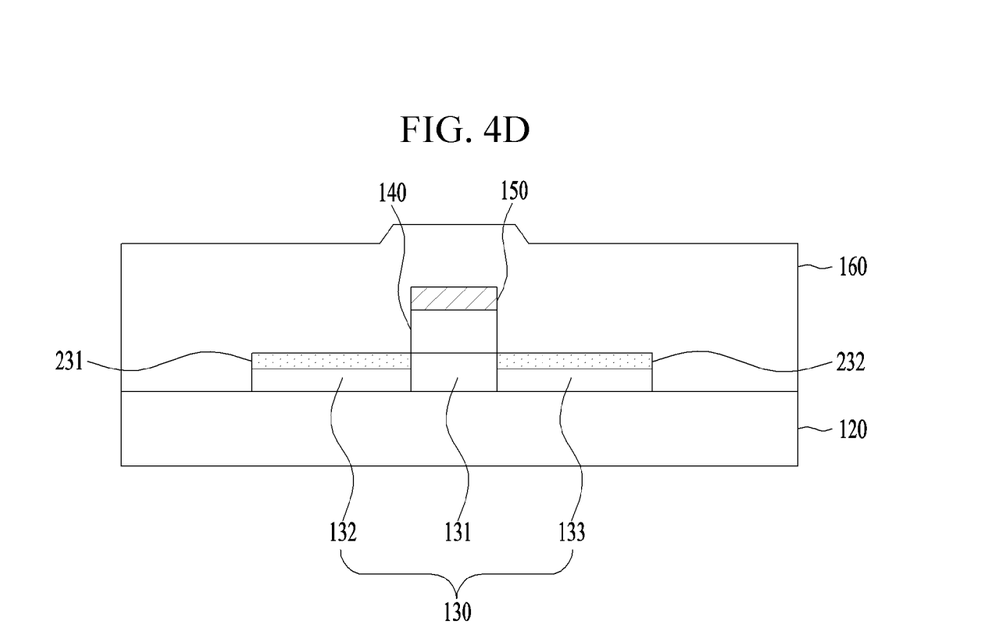
Figure 4E:
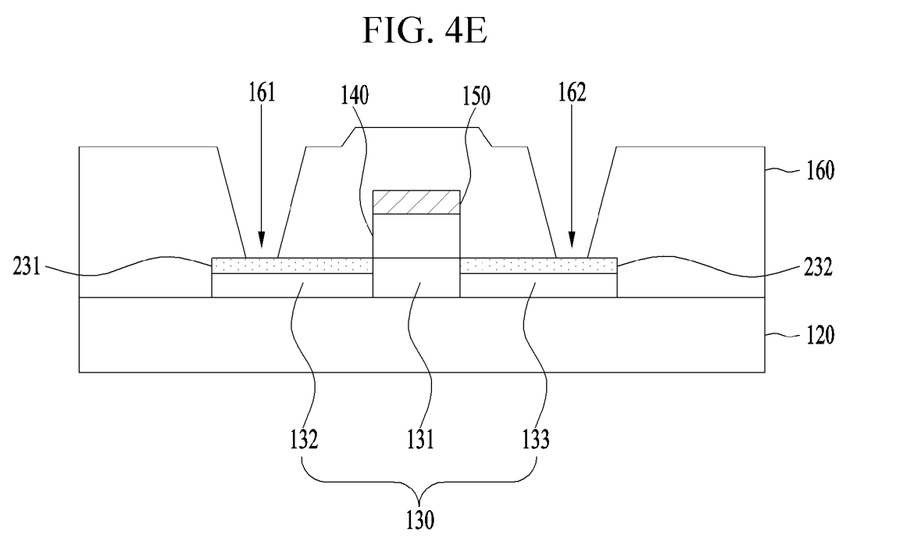

As illustrated in FIGS. 3, 4D and 4E, an interlayer insulation layer 160 is deposited 318 on the gate electrode 150 and the first and second diffused portions 231 and 232. First and second contact holes 161 and 162 are patterned 320 in the interlayer insulating layer 160.

In detail, as illustrated in FIG. 4D, the interlayer insulation layer 160 is formed on the substrate 120 on which the gate electrode 150 is formed using plasma enhanced CVD (PECVD). Then, as illustrated in FIG. 4E, the interlayer insulation layer 160 is patterned using a photolithography process and an etching process to form the first and second contact holes 161 and 162. Herein, the first contact hole 161 passes through the interlayer insulation layer 160 to expose at least a portion of the first diffused portion 231 of the source region 132. The second contact hole 162 passes through the interlayer insulation layer 160 to expose at least a portion of the second diffused portion 232 of the source region 133.

As described above, at least a portion of vacancies where oxygen is released are replaced with Si to form the Si-diffused first and second diffused portions 231 and 232, thereby preventing oxygen from being introduced into the vacancies by diffusion upon formation of the interlayer insulation layer 160. Accordingly, the oxygen concentration in the first and second diffused portions 231 and 232 may be 20 to 80% of the oxygen concentration of the channel region 131 to maintain good conductivity.

In the case that no first and second diffused portions 231 and 232 are present, upon formation of the interlayer insulation layer 160, oxygen is diffused into the conductive portions of the source and drain regions 132 and 133 having 15% of the oxygen concentration of the channel region 131, and the oxygen concentration in these portions of the source and drain regions 132 and 133 can be recovered to above 90% of that in the channel region 131. Thereby, the source and drain regions 132 and 133 do not maintain good conductivity.

Figure 4F:
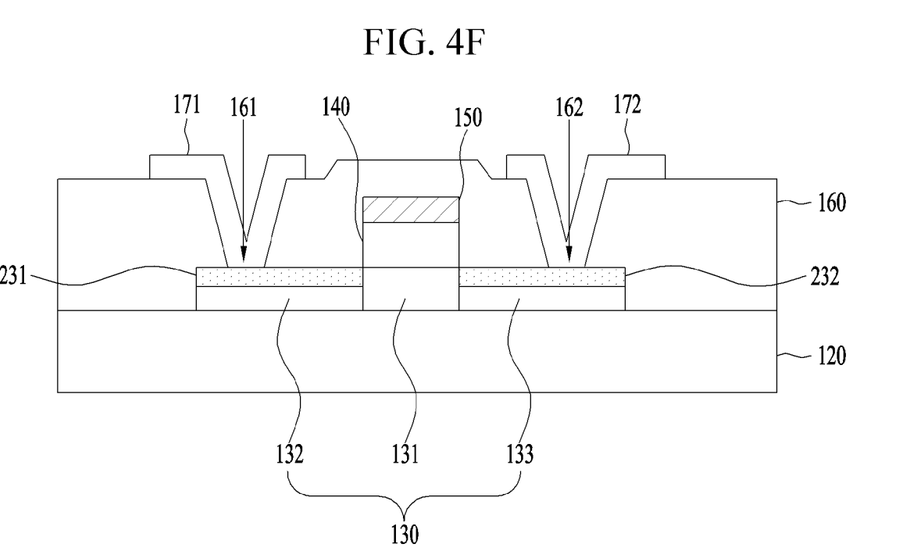

As illustrated in FIGS. 3 and 4F, the source electrode 171 and the drain electrode 172 are patterned 322 on the interlayer insulation layer 160.

In detail, a source and drain metallic layer is formed on the interlayer insulation layer 160 having the first and second contact holes 161 and 162 using a deposition method such as a sputtering process. The source and drain metallic layer is formed of Mo, Ti, Cu, AlNd, Al, Cr or alloys thereof to have a single layer or multilayer structure. Then, the source and drain metallic layer is patterned by a photolithography process and an etching process to form the source electrode 171 and the drain electrode 172 on the interlayer insulation layer 160.

Figure 4G:
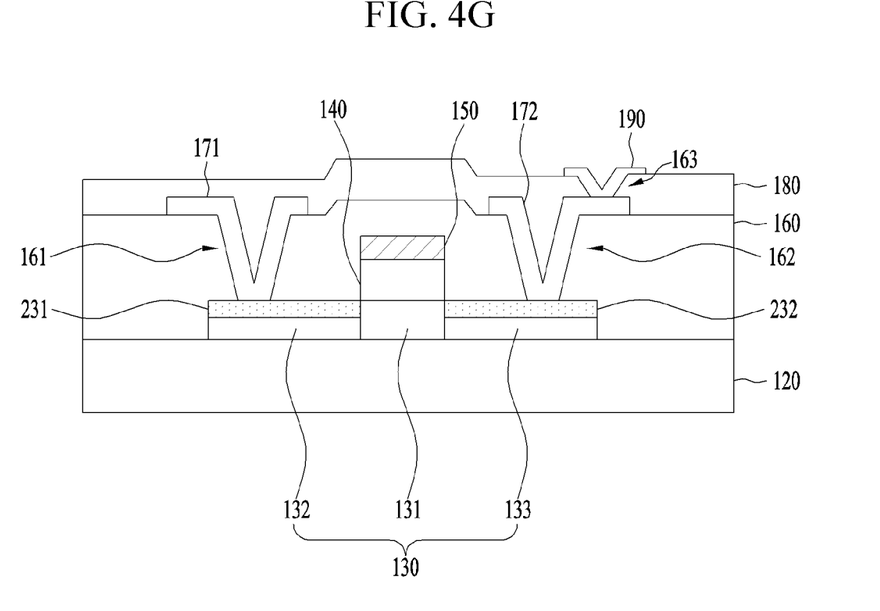

As illustrated in FIGS. 3 and 4G, the passivation layer 180 is formed 324 on the interlayer insulation layer 160 at which the source electrode 171 and the drain electrode 172 are formed. The third contact hole 163 is formed through the passivation layer 180 such that the pixel electrode 190 is in contact with the drain electrode 172. In addition, the pixel electrode 190 being in contact with the drain electrode 172 is formed through the third contact hole 163.

Hereinafter, in Tables 1 to 4, samples including indium gallium zinc oxide (IGZO) used as the oxide semiconductor and $SiO_2$ used as the buffer layer and the interlayer insulation layer were measured for oxygen amounts. However, the oxide semiconductor is not limited to indium gallium zinc oxide (IGZO).

Table 1 is a table explaining the oxygen concentration difference according to whether the diffused portions are present or not present, using a quantitative composition analysis such as Rutherford backscattering spectrometry (RBS).

TABLE 1

|  | With diffused portion | Without diffused portion |
| --- | --- | --- |
| Oxygen concentration in source/drain regions before forming gate insulation layer | $4.8 \times 10^{22}$ atoms/cm$^3$(100%) | $4.8 \times 10^{22}$ atoms/cm$^3$(100%) |
| Oxygen concentration in source/drain regions after forming gate insulation layer | $7 \times 10^{21}$ atoms/cm$^3$(15%) | $7 \times 10^{21}$ atoms/cm$^3$(15%) |
| Oxygen concentration in source/drain regions after forming interlayer insulation layer | $1 \times 10^{22}$ atoms/cm$^3$ to $4 \times 10^{22}$/cm$^3$ (20 to 80%) | $4.3 \times 10^{22}$ atoms/cm$^3$ (90%) |

The oxygen concentration in the source and drain regions 231 and 232 before forming the gate insulation layer 140 is $4.8 \times 10^{22}$ atoms/cm$^3$. In addition, upon formation of the gate insulation layer 140, the oxygen concentration in the source and drain regions 132 and 133 is $7 \times 10^{21}$ atoms/cm$^3$ after performing a dry etching process. During the dry etching process, the source and drain regions 132 and 133 become conductive due to releasing 85% of the oxygen concentration in the source and drain regions 132 and 133 with 15% remaining, and is therefore oxygen-deficient.

When the interlayer insulation layer 160 is formed without the first and second diffused portions 231 and 232, the oxygen concentration included in the upper portions of the source and drain regions 132 and 133 is above $4.3 \times 10^{22}$ atoms/cm$^3$. This means that the oxygen concentration in the source and drain regions 132 and 133 is recovered by 90% or more of its original concentration before forming the gate insulating layer 140.

When the first and second diffused portions 231 and 232 are formed, the oxygen concentration included in the diffused portions 231 and 232 is $1 \times 10^{22}$ atoms/cm$^3$ to $4 \times 10^{22}$ atoms/cm$^3$. This means that the oxygen concentration of the source and drain regions 132 and 133 is recovered by 15% to 80% of the oxygen concentration of the source and drain regions 132 and 133 before the gate insulation layer 140 is formed.

Namely, when the interlayer insulation layer 160 is formed without the diffused portions 231 and 232, the oxygen concentration at the surface of the source and drain regions 132 and 133 is recovered by above 90% of the oxygen concentration in the source and drain regions 132 and 133 before the gate insulation layer 140 is formed, thereby decreasing electron mobility of the device. However, when the diffused portions 231 and 232 are provided, the oxygen concentration included in the diffused portions 231 and 232 disposed at upper portions of the source and drain regions 132 and 133 may be decreased by 10 to 80%.

Figure 5A:
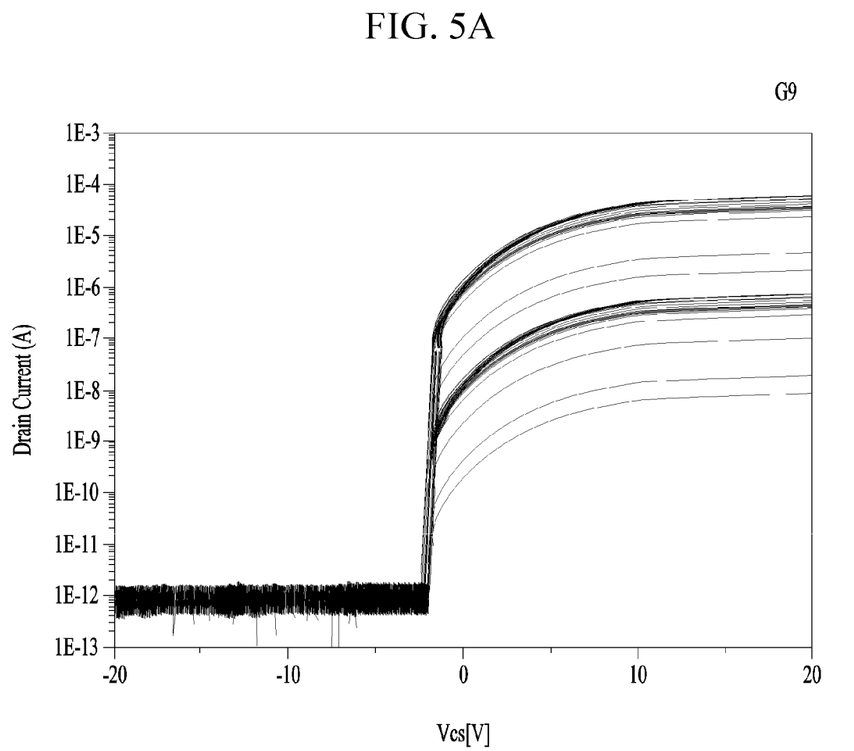
FIG. 5A is a graph illustrating properties of a thin film transistor without an oxidation protection layer.
Figure 5B:
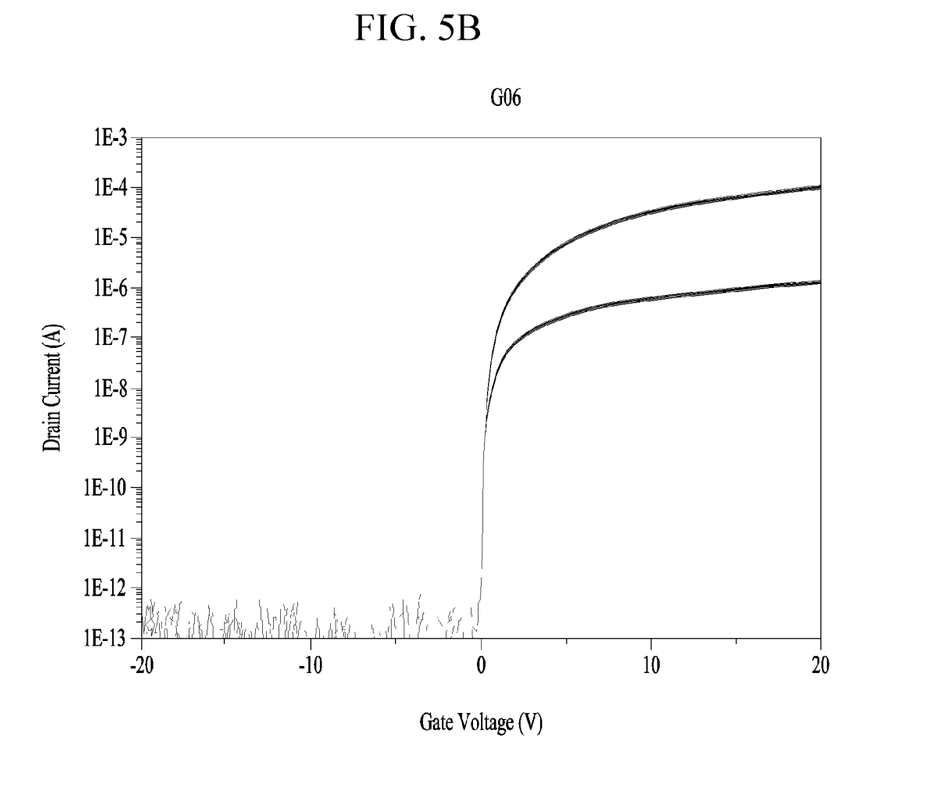
FIG. 5B is a graph illustrating properties of a thin film transistor without the oxidation protection layer.

FIG. 5A is a graph illustrating properties of the thin film transistor without the diffused portion. FIG. 5B is a graph illustrating properties of the thin film transistor with the diffused portion. Table 2 is a table explaining electron mobility (UFE) and sheet resistance according to whether the diffused portions are present or not.

TABLE 2

|  | With diffused portion | Without diffused portion |
| --- | --- | --- |
| Vth | 2.55 | 0.48 |
| UFE [cm$^2$/Vs] | 4.3 | 10.4 |
| Sheet Resistance [kΩ/□] | 68.5 | 2.32 |

Referring to Table 2 and FIG. 5A, when there are no diffused portions, electron mobility is 4.3 cm$^2$/Vs and sheet resistance is 68.5 kΩ/☐. However, referring to Table 2 and FIG. 5B, when there are diffused portions, electron mobility is 10.4 cm²/Vs and sheet resistance is 2.32 kΩ/☐. Namely, due to the diffused portions, electron mobility may be improved and sheet resistance may be decreased. The diffused portions may be used for formation of ohmic contact upon contact with metal.

Table 3 is a table explaining electron mobility and sheet resistance before or after a heating process when the diffused portions are formed by diffusion of hydrogen (H) into the conductive regions, instead of Si.

TABLE 3

|  | Before heating | After heating |
|---|---|---|
| UFE [cm²/Vs] | 11 | 9 |
| Sheet Resistance [kΩ/☐] | 2.17 | 7.4 |

Before the heating process, electron mobility and sheet resistance of the H-diffused oxidation protection layer is the same as the electron mobility and sheet resistance of the Si-diffused oxidation protection layer, respectively.

However, after the heating process, electron mobility of the H-diffused oxidation protection layer is decreased form 11 cm²/Vs to 9 cm²/Vs and sheet resistance of the H-diffused oxidation protection layer is increased from 2.17 kΩ/☐ to 7.4 kΩ/☐. When the H-diffused oxidation protection layer is formed, the oxidation protection layer is vulnerable to heat, and the electron mobility is decreased and the sheet resistance is increased upon the heating process.

In the case of the Si-diffused portion according to the illustrated embodiment of the present disclosure, electron mobility is 10.4 cm²/Vs and sheet resistance is 2.32 kΩ/☐, which is a higher electron mobility and lower sheet resistance in comparison with the H-diffused portion. Namely, diffusion of Si may generate a conductive region that is more thermally-stable than that created by diffusion of H.

Namely, the first and second diffused portions 231 and 232 in which Si is diffused into the active layer 130 are provided at the source region 132 and the drain region 133 using the above-described manufacturing method and, as such, the oxygen concentration in the diffused portions 231 and 232 may remain low, that is, 20 to 80% of the oxygen concentration in the channel region 131. Thereby, thermally-stable conductive regions may be secured.

Table 4 is a table explaining sheet resistance according to the amount of Si diffused into the source and drain regions.

| The amount of Si diffused into the source and drain regions [atoms/cm³] | Sheet Resistance according to position [kΩ/☐] | | | | |
|---|---|---|---|---|---|
|  | 1 | 2 | 3 | 4 | 5 |
| More than $4 \times 10^{22}$ | More than 10 | | | | |
| $1 \times 10^{22}$~$4 \times 10^{22}$ | 3.5 | 2.5 | 4.1 | 4.5 | 3 |
|  | 3.3 | 2.4 | 3.7 | 4.3 | 2.7 |
|  | 3.5 | 2.5 | 4.4 | 4.7 | 3 |
|  | 3.8 | 2.6 | 3.9 | 4.3 | 3.2 |
| Less than $1 \times 10^{22}$ | 5 | 3.4 | 6 | 7 | 6 |

Referring to Table 4, when the amount of Si diffused into the source and drain regions is more than $4 \times 10^{22}$, the sheet resistance is increased to more than 10 kΩ/☐. Also, when the amount of Si diffused into the source and drain regions is less than $1 \times 10^{22}$, the sheet resistance can be increased to more than 5 kΩ/☐ in most positions, with the exception of one position that has a sheet resistance of 3.4 kΩ/☐. However, when the amount of Si diffused into the source and drain regions is from $1 \times 10^{22}$ to $4 \times 10^{22}$, the sheet resistance may maintain a low level being less than 5 kΩ/☐.

The thin film transistor according to the illustrated embodiment of the present is applied to a display device such as a liquid crystal display device and an organic electric-field light emitting device, or a switching device of a driving circuit such as a gate driver formed on the substrate.

Figure 6A:
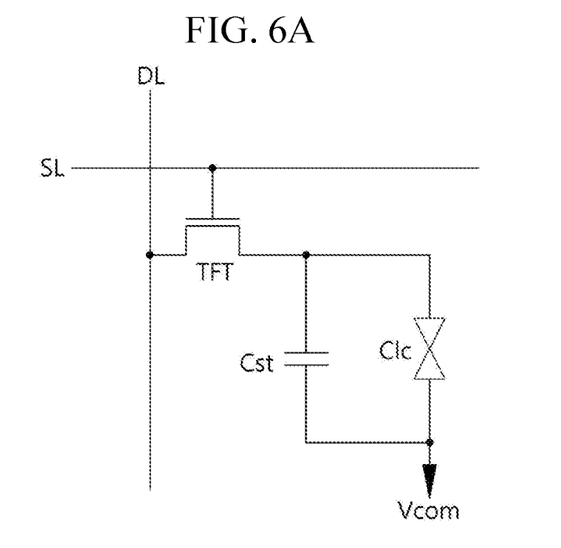
FIG. 6A is a view illustrating a liquid crystal display device to which the thin film transistor according to an embodiment of the present disclosure is applied.

As illustrated in FIG. 6A, the thin film transistor according to the illustrated embodiment of the present disclosure can be applied to the liquid crystal display device to operate a liquid crystal cell Clc. The thin film transistor TFT is turned on by a gate-on-voltage from a scan line SL to supply a data signal of a data line DL to the pixel electrode of the liquid crystal cell Clc. The liquid crystal cell Clc receives a difference between a common voltage Vcom supplied to a common electrode and the data signal. The liquid crystal cell Clc maintains a voltage applied to the liquid crystal cell Clc when the thin film transistor is turned off by a gate off voltage. The liquid crystal cell Clc operates liquid crystal molecules according to the applied voltage to adjust light transmittance thereby displaying an image.

Figure 6B:
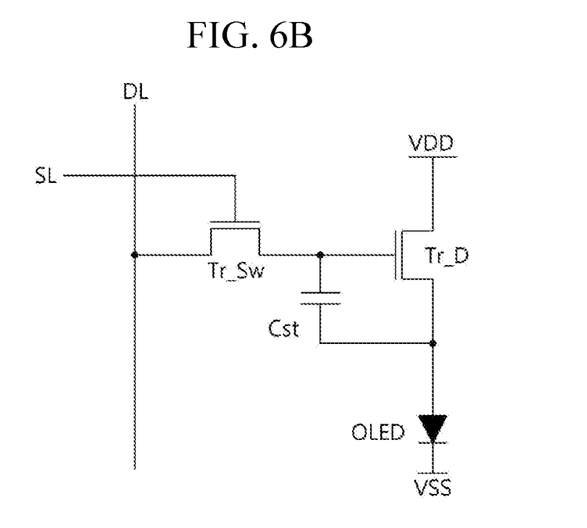
FIG. 6B is a view illustrating an organic electroluminescence display device according to an embodiment of the present disclosure.

As illustrated in FIG. 6B, the thin film transistor according to the illustrated embodiment of the present disclosure can be applied to the organic electric-field light emitting device as a driving transistor Tr_D and a switching transistor Tr_Sw for operating an organic light-emitting diode OLED.

The switching transistor Tr_Sw responds to a gate voltage supplied through a scan line SL to perform a switching operation in which a data signal supplied through a data line DL is stored in a storage capacitor Cst as a data voltage.

The driving transistor Tr_D allows driving current to flow between a high voltage line VDD and a low voltage line VSS according to the data voltage stored in the storage capacitor Cst.

The organic light emitting diode OLED includes an anode electrode connected to the driving transistor Tr_D and a cathode electrode facing the anode electrode, in which a light emitting layer is interposed therebetween. The organic light emitting diode OLED operates to emit light according to driving current formed by the driving transistor Tr_D.

As is apparent from the above description, according to the present disclosure, the thin film transistor includes first and second diffused portions having Si replacing oxygen vacancies at the source and drain regions to prevent oxygen from being supplied to the conductive regions from the interlayer insulation layer to lower contact resistance between the source and drain electrodes and the active layer, and to secure heat-stable conductive regions. Thereby, properties of the thin film transistor may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor comprising:
    an active layer of oxide semiconductor on a substrate, the active layer including a source region, a drain region, and a channel region located between the source region and the drain region;

a gate electrode located on the channel region of the active layer;
a gate insulating layer between the active layer and the gate electrode; and
an interlayer insulating layer on the gate electrode and the active layer,
wherein each of the source region and the drain region includes an oxidation preventing film and a conductive region between the substrate and the oxidation preventing film, the oxidation preventing film comprising Si and oxide semiconductor, wherein the conductive region in each of the source region and the drain region is a conductorized region of the oxide semiconductor, and
wherein an oxygen concentration in the conductive region is lower than an oxygen concentration in the channel region, the oxygen concentration indicating an amount of oxygen per unit volume.

2. The thin film transistor of claim 1, wherein the conductive region and the channel region include the oxide semiconductor without Si.

3. The thin film transistor of claim 1, wherein the oxygen concentration in the oxidation preventing film is 20% to 80% of the oxygen concentration in the channel region.

4. The thin film transistor of claim 1, wherein an amount of Si in the oxidation preventing film is from $1\times10^{22}$ atoms/cm$^3$ to $4\times10^{22}$ atoms/cm$^3$.

5. The thin film transistor of claim 1, wherein a thickness of the oxidation preventing film is 50 Å to 100 Å.

6. The thin film transistor of claim 1, wherein the interlayer insulating layer is in contact with the oxidation preventing film, and wherein the interlayer insulating layer includes Si, and oxide.

7. A display panel comprising:
a thin film transistor on a substrate, the thin film transistor including an active layer of oxide semiconductor, the active layer composed of a source region, a channel region, and a drain region, which are disposed adjacent to each other;
a first oxidation preventing film on a first conductive region in the source region of the active layer;
a second oxidation preventing film on a second conductive region in the drain region of the active layer; and
an interlayer insulating layer on the thin film transistor, the first oxidation preventing film, and the second oxidation preventing film,
wherein the first oxidation preventing film and the second oxidation preventing film include Si and the oxide semiconductor, wherein each of the first conductive region and the second conductive region is a conductorized region of the oxide semiconductor, and
wherein each of the first conductive region and the second conductive region has an amount of oxygen per unit volume lower than the channel region.

8. The display panel of claim 7, wherein an amount of Si in the first oxidation preventing film and the second oxidation preventing film is from $1\times10^{22}$ atoms/cm$^3$ to $4\times10^{22}$ atoms/cm$^3$.

9. The display panel of claim 7, wherein the thin film transistor further includes a gate insulation layer on the channel region of the active layer, and a gate electrode on the gate insulation layer, and
wherein the first oxidation preventing film and the second oxidation preventing film are disposed outside the gate insulation layer.

10. The display panel of claim 9, wherein the gate insulation layer and the gate electrode have the same pattern.

11. The display panel of claim 7, wherein the interlayer insulating layer includes Si and oxide.

12. The display panel of claim 11, wherein the interlayer insulating layer is in contact with the first oxidation preventing film and the second oxidation preventing film.

13. The display panel of claim 7, wherein a thickness of each of the first oxidation preventing film and the second oxidation preventing film is 50 Å to 100 Å.

14. The display panel of claim 7, wherein an oxygen concentration in the first oxidation preventing film and the second oxidation preventing film is 20% to 80% of the oxygen concentration in the channel region.

15. The display panel of claim 7, wherein each of the first conductive region and the second conductive region has a number of oxygen vacancies greater than the channel region.

16. The display panel of claim 7, wherein the active layer includes indium gallium zinc oxide (InGaZnO).

17. The display panel of claim 7, wherein a lower surface of the first oxidation preventing film and the second oxidation preventing film toward the substrate is lower than an upper surface of the channel region opposite to the substrate.

18. The display panel of claim 7, further comprising a liquid crystal cell connected to the thin film transistor.

19. The display panel of claim 7, further comprising an organic light-emitting diode,
wherein the organic light-emitting diode includes a light emitting layer interposed between a cathode electrode and an anode electrode, and
wherein the cathode electrode or the anode electrode is connected to the thin film transistor.

20. A display device comprising the display panel of claim 7.

* * * * *